(12) United States Patent
Liu

(10) Patent No.: US 8,188,518 B2
(45) Date of Patent: May 29, 2012

(54) THIN FILM TRANSISTOR STRUCTURE OF PIXEL WITH DRAIN EXTENSIONS OVERLAPPING GATE ELECTRODE AND GATE ELECTRODE EXTENTION

(75) Inventor: Chih-Chung Liu, Guangdong (CN)

(73) Assignee: Century Display(ShenZhen) Co., Ltd., Longhua, Baoan, Shen-zhen, Guangdong (CN)

( * ) Notice: Subject to any disclaimer, the term of this patent is extended or adjusted under 35 U.S.C. 154(b) by 96 days.

(21) Appl. No.: 12/869,754

(22) Filed: Aug. 27, 2010

(65) Prior Publication Data
US 2010/0320473 A1    Dec. 23, 2010

Related U.S. Application Data

(63) Continuation of application No. PCT/CN2009/072493, filed on Jun. 26, 2009.

(30) Foreign Application Priority Data

Jan. 9, 2009  (CN) .......................... 2009 1 0036563

(51) Int. Cl.
*H01L 29/786* (2006.01)

(52) U.S. Cl. . 257/213; 257/262; 257/326; 257/E29.273; 257/E29.242

(58) Field of Classification Search ................... 257/213, 257/262, 326, E29.273, E29.242
See application file for complete search history.

(56) References Cited

U.S. PATENT DOCUMENTS

| | | | |
|---|---|---|---|
| 5,782,665 A * | 7/1998 | Weisfield et al. | 445/24 |
| 2006/0279668 A1 * | 12/2006 | Paik et al. | 349/43 |
| 2008/0302969 A1 * | 12/2008 | Jung et al. | 250/370.09 |
| 2009/0268119 A1 * | 10/2009 | Lee et al. | 349/54 |

* cited by examiner

*Primary Examiner* — Thanh V Pham
(74) *Attorney, Agent, or Firm* — Winston Hsu; Scott Margo

(57) ABSTRACT

A thin film transistor structure of a pixel is provided. In the present invention, a first metal layer serves as a gate electrode, and the gate electrode includes an extending gate electrode portion. A second metal layer includes a drain electrode partially and respectively overlapping the gate electrode and the gate electrode portion with the amorphous silicon layer interposed therebetween so as to form a first parasitic capacitor and a second parasitic capacitor. The total capacitance of the first parasitic capacitor and the second parasitic capacitor is invariable to withstand deviation caused by vibration of the machine in the photolithographic process, so that undesired effects in the liquid crystal display panel such as mura and flicker can be reduced.

6 Claims, 9 Drawing Sheets

THIN FILM TRANSISTOR STRUCTURE OF PIXEL WITH DRAIN EXTENSIONS OVERLAPPING GATE ELECTRODE AND GATE ELECTRODE EXTENTION

CROSS REFERENCE TO RELATED APPLICATIONS

This application is a continuation of International Application No. PCT/CN2009/072493 filed on Jun. 26, 2009.

BACKGROUND OF THE INVENTION

1. Field of the Invention

The present invention relates to a thin film transistor structure, and more particularly, to a thin film transistor structure of a pixel which can be applied to a lower substrate of a liquid crystal display panel.

2. Description of the Prior Art

Manufacturing processes of thin film transistor liquid crystal display (TFT LCD) panels include array processes and color filter processes, wherein required electrode substrates, which include voltage-controlled thin film transistors for transmitting signals, are formed in the array processes. Refer to FIG. 1, which is a schematic diagram illustrating a thin film transistor in the prior art. As shown in FIG. 1, a first metal layer 10 serves as a gate electrode 12, and an amorphous silicon layer 14 is formed on the first metal layer 10 and partially overlaps the first metal layer 10. A second metal layer 16 is disposed on the first metal layer 10, and the second metal layer 16 includes a drain electrode 18, a source electrode 20 and a data line 22. The drain electrode 18 is T-shaped and extends to partially overlap the amorphous silicon layer 14. The source electrode 20 is disposed on the amorphous silicon layer 14, and the source electrode 20 is U-shaped and corresponds to the drain electrode 18. Furthermore, the source electrode 20 is connected to the data line 22 which is transversely above the first metal layer 10. In addition, a pixel electrode layer 24 is disposed on the drain electrode 18 and is electrically connected to the drain electrode 18 through a via hole 26.

When a photolithographic process of the array processes is performed, deviation may occur due to slight vibration of an exposure machine in a light exposure process. As shown in FIG. 2, the location of the drain electrode 18 shifts downwardly in the longitudinal direction with respect to that in FIG. 1. As an area of an overlapping region between the amorphous silicon layer 14 and the drain electrode 18 formed by the second metal layer 16 varies, a parasitic capacitor (Cgd) between the gate electrode 12 and the drain electrode 18 would vary. As a result, feed-through voltage of the pixel electrode which is caused by the parasitic capacitor would accordingly vary due to variance of the parasitic capacitor, and some undesired effects such as mura and flicker may occur in local regions of the liquid crystal display panel.

Therefore, for the aforementioned problems, a thin film transistor structure is provided in the present invention to withstand deviation caused by vibration of the machine in the photolithographic process.

SUMMARY OF THE INVENTION

It is therefore one of the objectives of the present invention to provide a thin film transistor structure to withstand deviation caused by vibration of the machine in the photolithographic process. Accordingly, the parasitic capacitor ($C_{gd}$) between the drain electrode and the gate electrode of the thin film transistor structure can be fixed, so that positive and negative voltages applied on the pixel electrode can be symmetrical and the voltage drop deviation of the direct current (DC) level can be reduced to minimum.

It is another one of the objectives of the present invention to provide a thin film transistor structure to reduce undesired effects in the liquid crystal display panel such as mura and flicker, so that display quality of the liquid crystal display panel can be improved.

To achieve the aforementioned objectives, a gate electrode is formed by a first metal layer in the thin film transistor structure of the present invention, and the gate electrode includes a gate electrode portion extending from the gate electrode. An insulating layer is disposed on the first metal layer, and an amorphous silicon layer is disposed on the insulating layer and is respectively disposed above the gate electrode and above the gate electrode portion. A second metal layer is disposed on the amorphous silicon layer, and the second metal layer includes a drain electrode and a source electrode. The source electrode is disposed on the amorphous silicon layer above the gate electrode. The drain electrode partially overlaps the amorphous silicon layer above the gate electrode and above the gate electrode portion respectively. A first parasitic capacitor is formed by a partially overlapping region between the drain electrode and the gate electrode with the amorphous silicon layer interposed therebetween, and a second parasitic capacitor is formed by a partially overlapping region between the drain electrode and the gate electrode portion with the amorphous silicon layer interposed therebetween. A total capacitance of the first parasitic capacitor and the second parasitic capacitor is invariable.

These and other objectives of the present invention will no doubt become obvious to those of ordinary skill in the art after reading the following detailed description of the preferred embodiment that is illustrated in the various figures and drawings.

DETAILED DESCRIPTION

A thin film transistor structure is provided in the present invention. A gate electrode of a first metal layer in the thin film transistor structure includes an extending gate electrode portion. A drain electrode of a second metal layer partially overlaps the gate electrode and the gate electrode portion with an amorphous silicon layer interposed therebetween, so that the parasitic capacitor ($C_{gd}$) between the drain electrode and the gate electrode can be fixed when deviation in the photolithographic process occurs. Some preferred embodiments are utilized to illustrate the technical feature of the present invention as follows.

Figure 1:
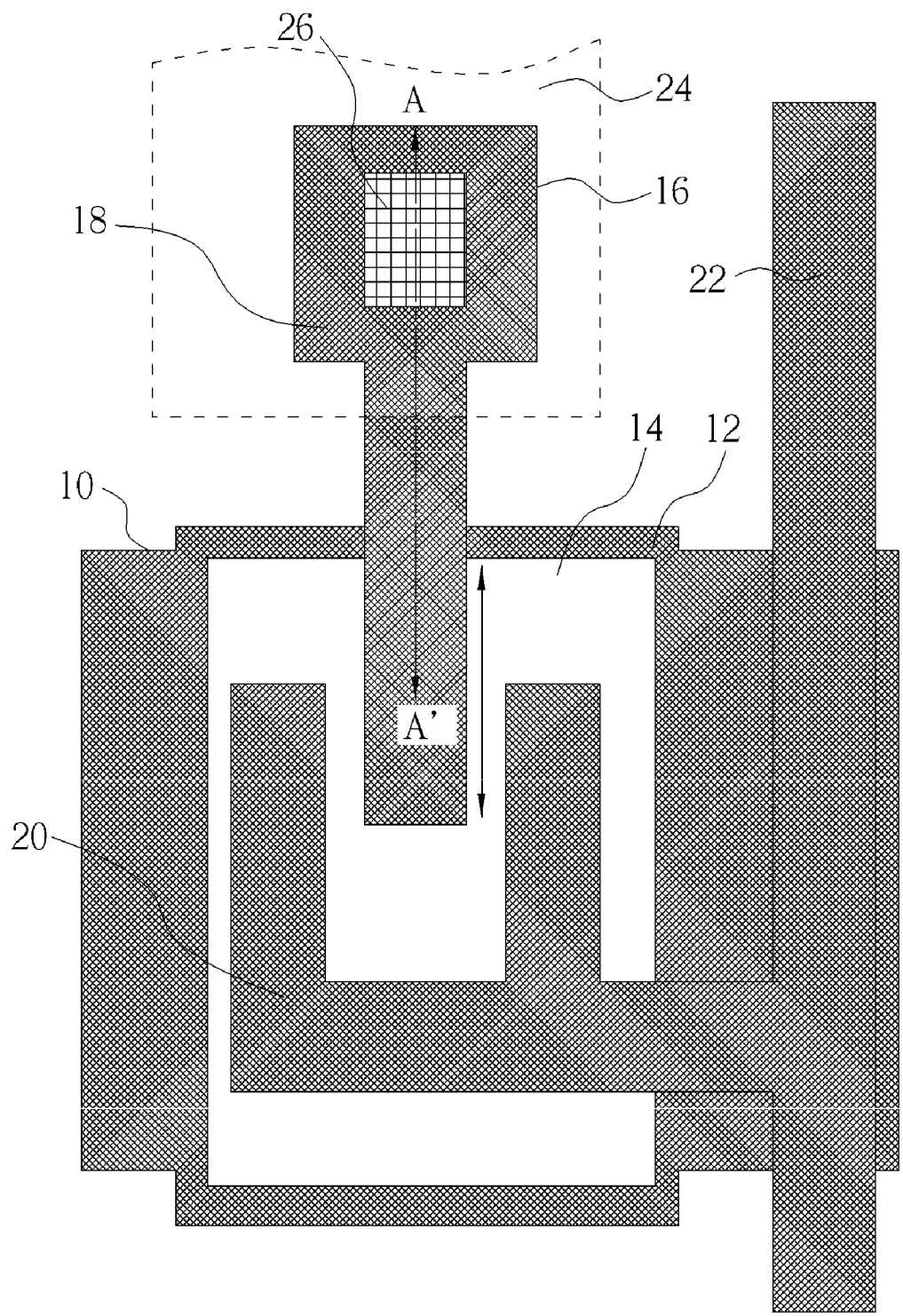
FIG. 1 is a schematic diagram illustrating a thin film transistor structure in the prior art.
Figure 2:
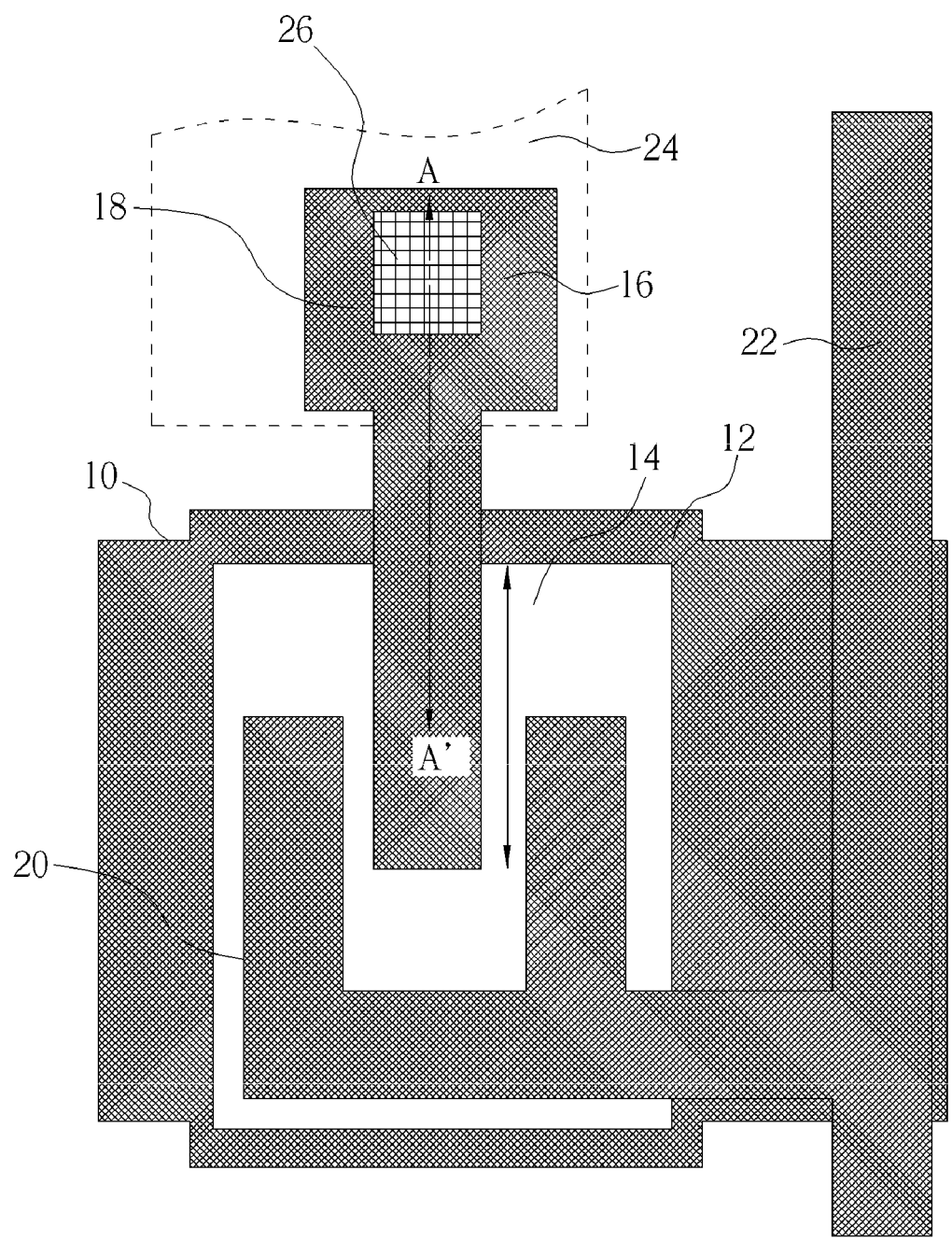
FIG. 2 is a schematic diagram illustrating the occurrence of the deviation in a thin film transistor structure of the prior art.
Figure 3A:
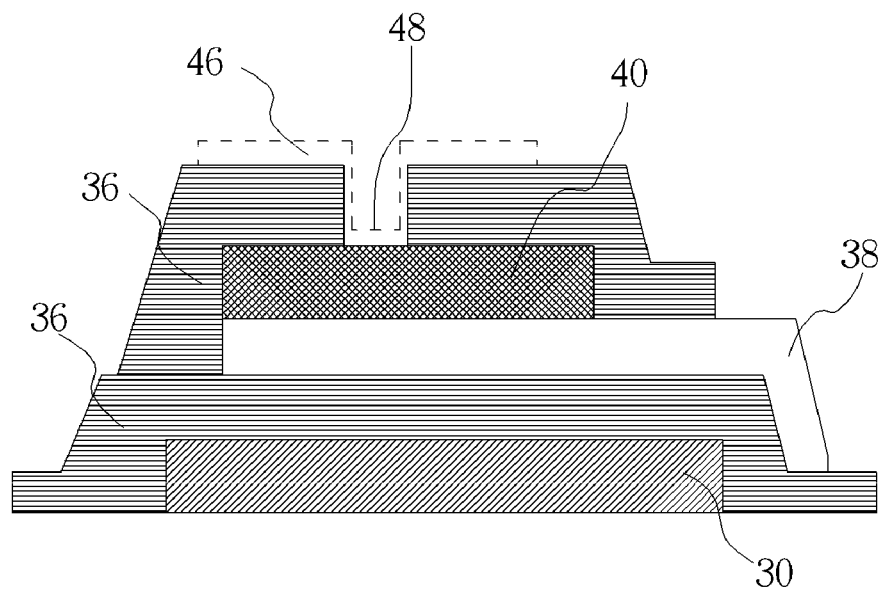
FIG. 3A is a schematic cross-sectional view illustrating the structure of the present invention.
Figure 3B:
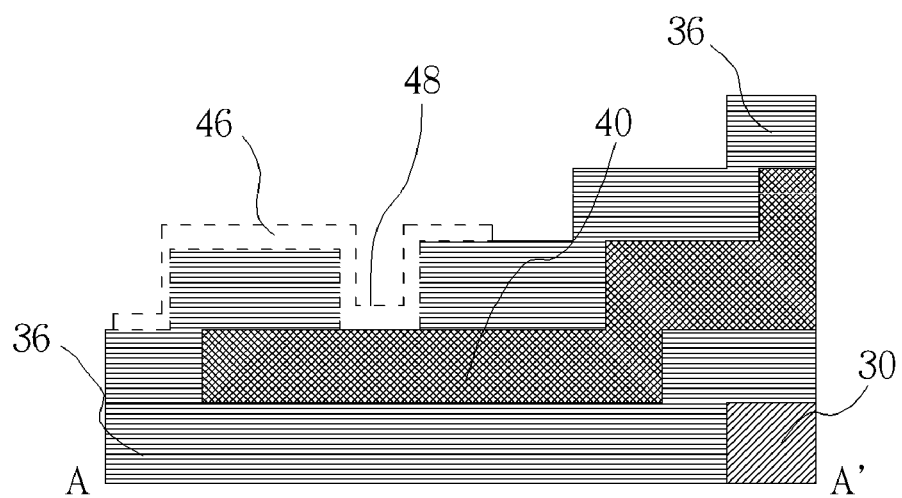
FIG. 3B is a schematic cross-sectional view illustrating the structure of the present invention taken along a sectional line A-A'.
Figure 4:
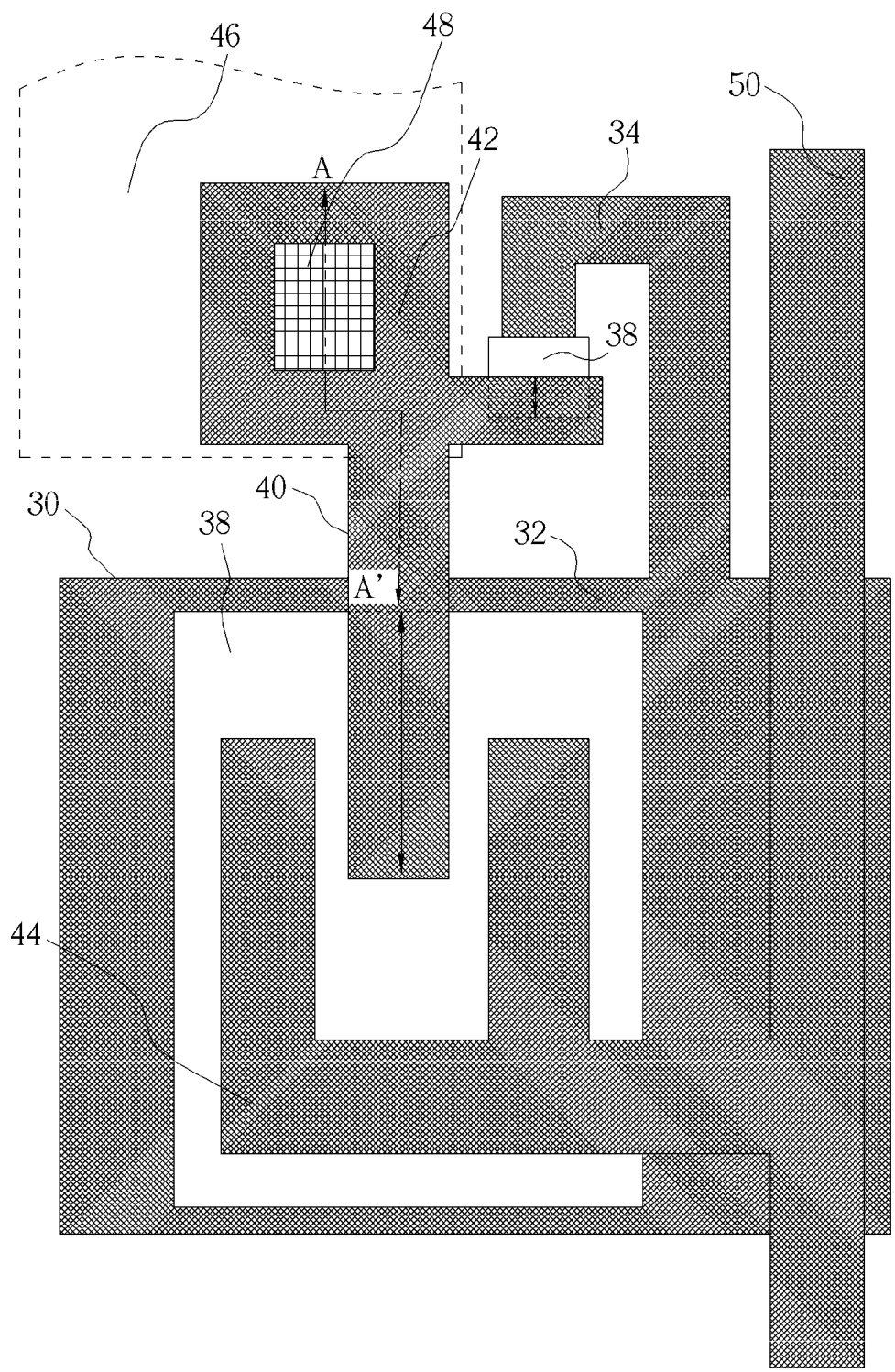
FIG. 4 is a schematic diagram illustrating the structural layout of the first preferred embodiment according to the present invention.

Please refer to FIG. 4, and also refer to the cross-sectional view of the structure shown in FIG. 3A and the cross-sectional view of the structure taken along a sectional line A-A' shown in FIG. 3B. As shown in FIG. 4, a first metal layer 30 serves as a gate electrode 32, and the gate electrode 32 includes an extending gate electrode portion 34. The gate electrode portion 34 is L-shaped. An insulating layer 36 is disposed on the first metal layer 30. An amorphous silicon layer 38 is formed on the insulating layer 36 and is respectively disposed on the gate electrode 32 and on the gate electrode portion 34. A second metal layer 40 is formed on the amorphous silicon layer 38, and the second metal layer 40 includes a drain electrode 42 and a source electrode 44. The source electrode 44 is disposed on the amorphous silicon layer 38 of the gate electrode 32, and the source electrode 44 is U-shaped with an opening facing up. One end of the drain electrode 42 longitudinally extends to the amorphous silicon layer 38 above the gate electrode 32 and corresponds to the center of the source electrode 44. The drain electrode 42 partially overlaps the gate electrode 32 with the amorphous silicon layer 38 interposed therebetween to form a first parasitic capacitor (not shown in the figure). The drain electrode 42 further includes a drain electrode portion. The drain electrode portion transversely extends to the amorphous silicon layer 38 above the gate electrode portion 34. The drain electrode 42 partially overlaps the gate electrode portion 34 with the amorphous silicon layer 38 interposed therebetween to form a second parasitic capacitor (not shown in the figure). The length of a partially overlapping region between the drain electrode 42 and the gate electrode 32 is equal to the length of a partially overlapping region between the drain electrode 42 and the gate electrode portion 34. In addition, an insulating layer 36 is formed on the second metal layer 40, and a via hole 48 is formed in the insulating layer 36 and corresponds to the location of the drain electrode 42 of the second metal layer 40. Subsequently, a pixel electrode layer 46 is formed on the insulating layer 36, and the pixel electrode layer 46 is electrically connected to the drain electrode 42 of the second metal layer 40 through the via hole 48. Moreover, a scan line (not shown in the figure) and a data line 50 are respectively connected to the gate electrode 32 of the first metal layer 30 and the source electrode 42 of the second metal layer 40.

Figure 5:
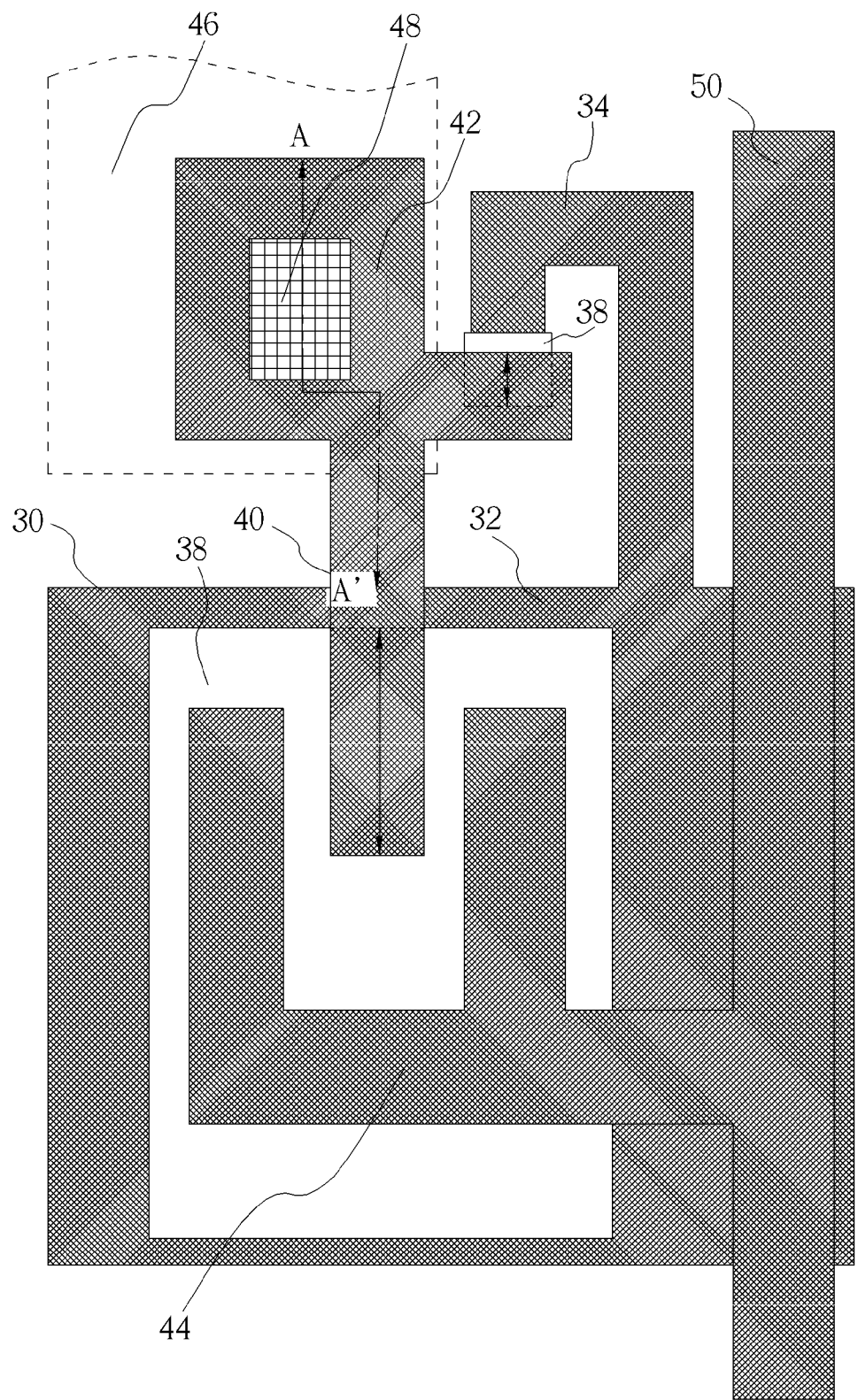
FIG. 5 is a schematic diagram illustrating the occurrence of the deviation in the first preferred embodiment of the present invention.

When deviation occurs due to vibration of the machine in the photolithographic process, as shown in FIG. 5, the location of the drain electrode 42 longitudinally shifts upwardly compared to that in FIG. 4. An area of a partially overlapping region between the drain electrode 42 and the gate electrode 32 with the amorphous silicon layer 38 interposed therebetween is decreased, and an area of a partially overlapping region between the drain electrode portion and the gate electrode portion 34 with the amorphous silicon layer 38 interposed therebetween is increased at the same time. Accordingly, the capacitance of the first parasitic capacitor decreases, and the capacitance of the second parasitic capacitor increases. The variance of the capacitance of the first parasitic capacitor and the second parasitic capacitor are the same. Due to the compensation, a total capacitance of the first parasitic capacitor and the second parasitic capacitor is invariable without being influenced by the deviation. Therefore, the parasitic capacitor ($C_{gd}$) between the drain electrode 42 and the gate electrode 32 can be fixed.

Figure 6:
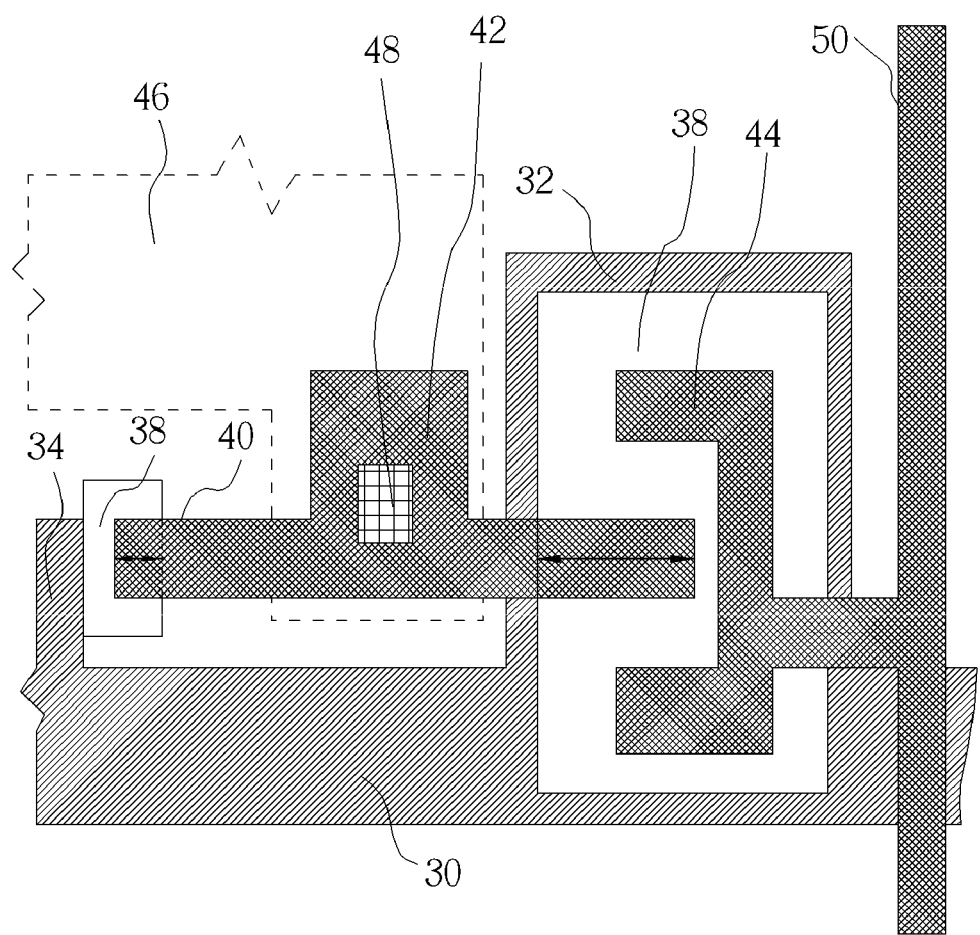
FIG. 6 is a schematic diagram illustrating the structural layout of the second preferred embodiment according to the present invention.
Figure 7:
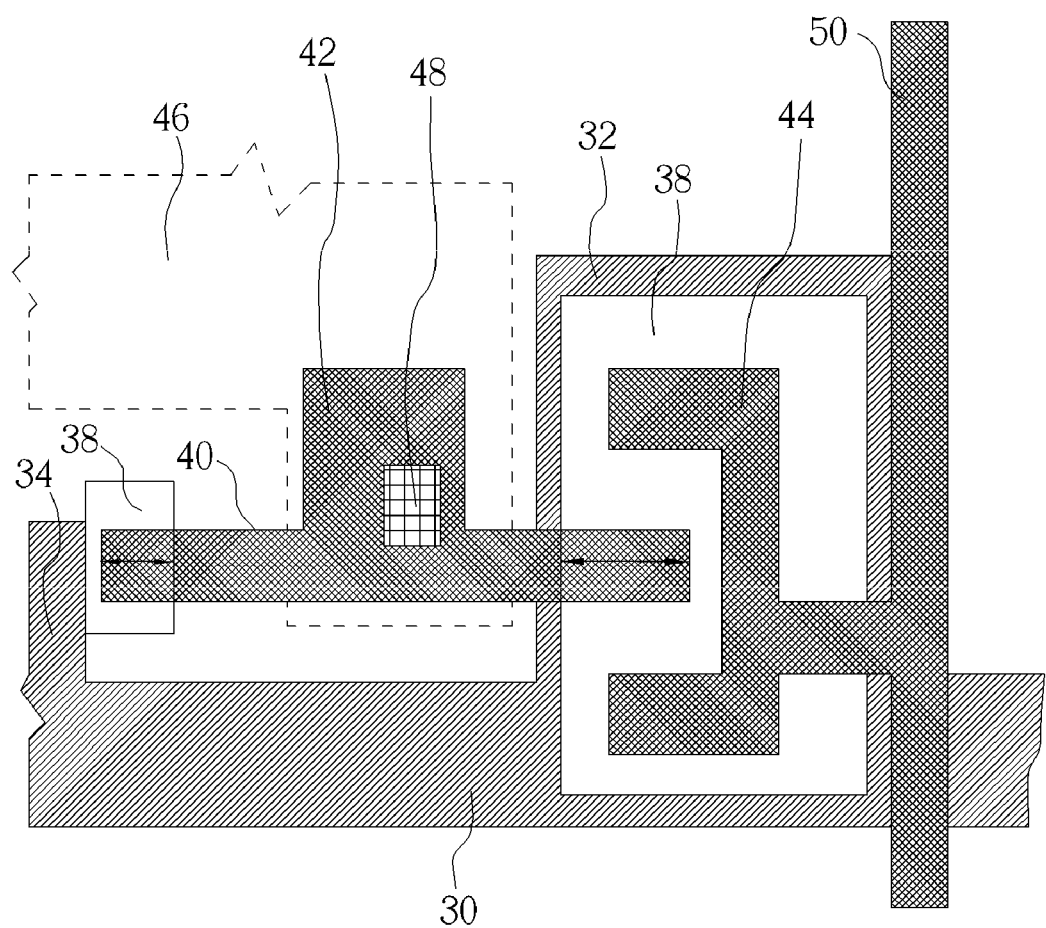
FIG. 7 is a schematic diagram illustrating the occurrence of the deviation in the second preferred embodiment of the present invention.

As described above, in the first preferred embodiment, the drain electrode 42 respectively longitudinally extends above and overlaps the gate electrode 32 and transversely extends above and overlaps the gate electrode portion 34, and the longitudinal deviation occurs. This embodiment can also withstand the variance of the parasitic capacitor caused by the transverse deviation of the drain electrode. In addition, the shapes and locations of the gate electrode 32, the gate electrode portion 34, the drain electrode 42, and the source electrode 44 can be respectively altered. Refer to FIG. 6 that is a schematic diagram illustrating the structural layout of the second preferred embodiment according to the present invention. As shown in FIG. 6, the gate electrode 32 of the first metal layer 30 includes a left-extended gate electrode portion 34. One end of the drain electrode 42 transversely extends to the amorphous silicon layer 38 above the gate electrode and corresponds to a U-shaped source electrode 44 with an opening facing right. The drain electrode 42 partially overlaps the gate electrode 32 with the amorphous silicon layer 38 interposed therebetween to form a first parasitic capacitor (not shown in the figure). The other end of the drain electrode 42 includes a drain electrode portion transversely extending to the amorphous silicon layer 38 above the gate electrode portion 34 to form a second parasitic capacitor (not shown in the figure). The length of a partially overlapping region between the drain electrode 42 and the gate electrode 32 is equal to the length of a partially overlapping region between the drain electrode portion and the gate electrode portion 34. Refer to FIG. 7, which is a schematic diagram illustrating the occurrence of the deviation in the second preferred embodiment of the present invention. As shown in FIG. 7, the drain electrode 42 transversely shifts toward the left. An area of a partially overlapping region between the drain electrode portion and the gate electrode portion 34 with the amorphous silicon layer 38 interposed therebetween is increased, and an area of a partially overlapping region between the drain electrode 42 and the gate electrode 32 with the amorphous silicon layer 38 interposed therebetween is decreased. Accordingly, the capacitance of the first parasitic capacitor decreases, and the capacitance of the second parasitic capacitor increases. Because the variance of the capacitance of the first parasitic capacitor and the second parasitic capacitor are the same, the total capacitance of the parasitic capacitor ($C_{gd}$) is relatively fixed.

Figure 8:
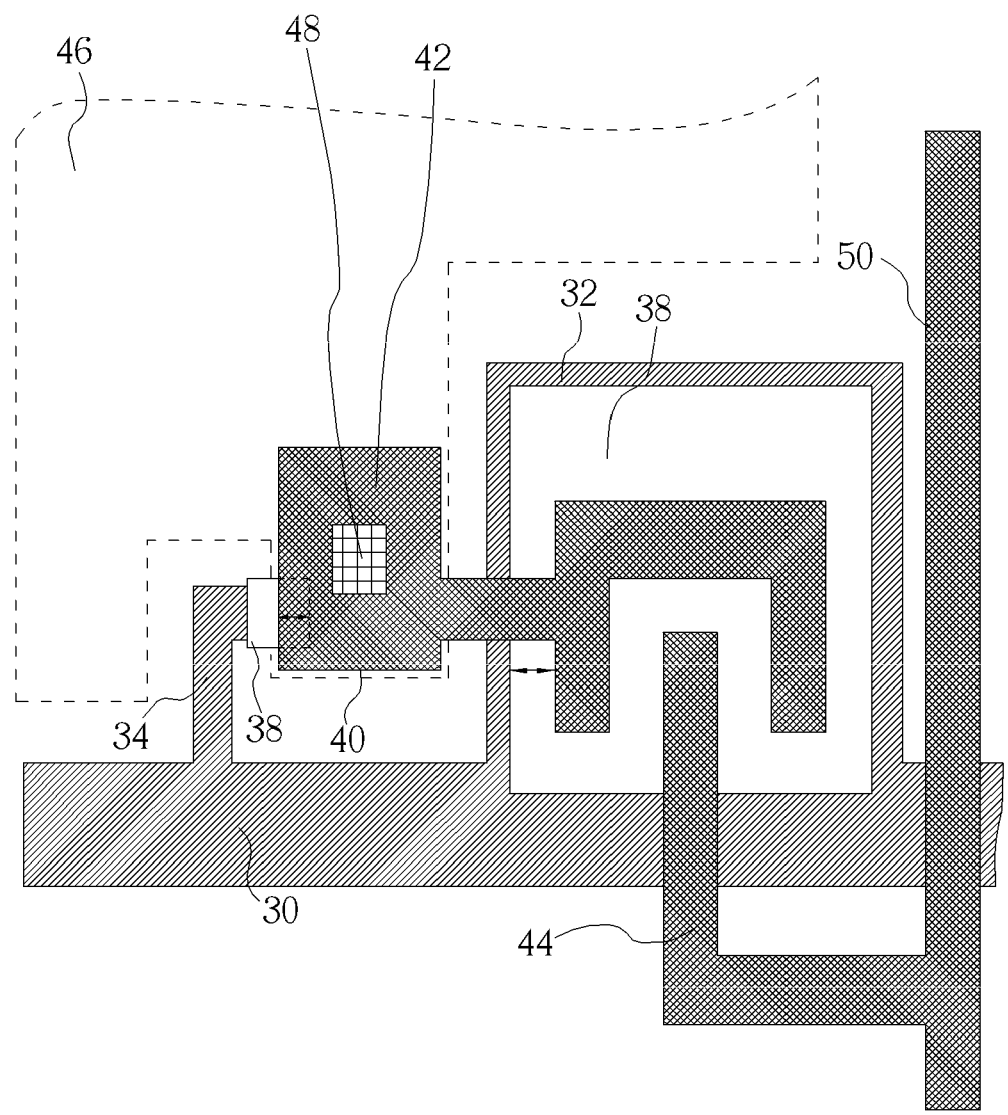
FIG. 8 is a schematic diagram illustrating the structural layout of the third preferred embodiment according to the present invention.
Figure 9:
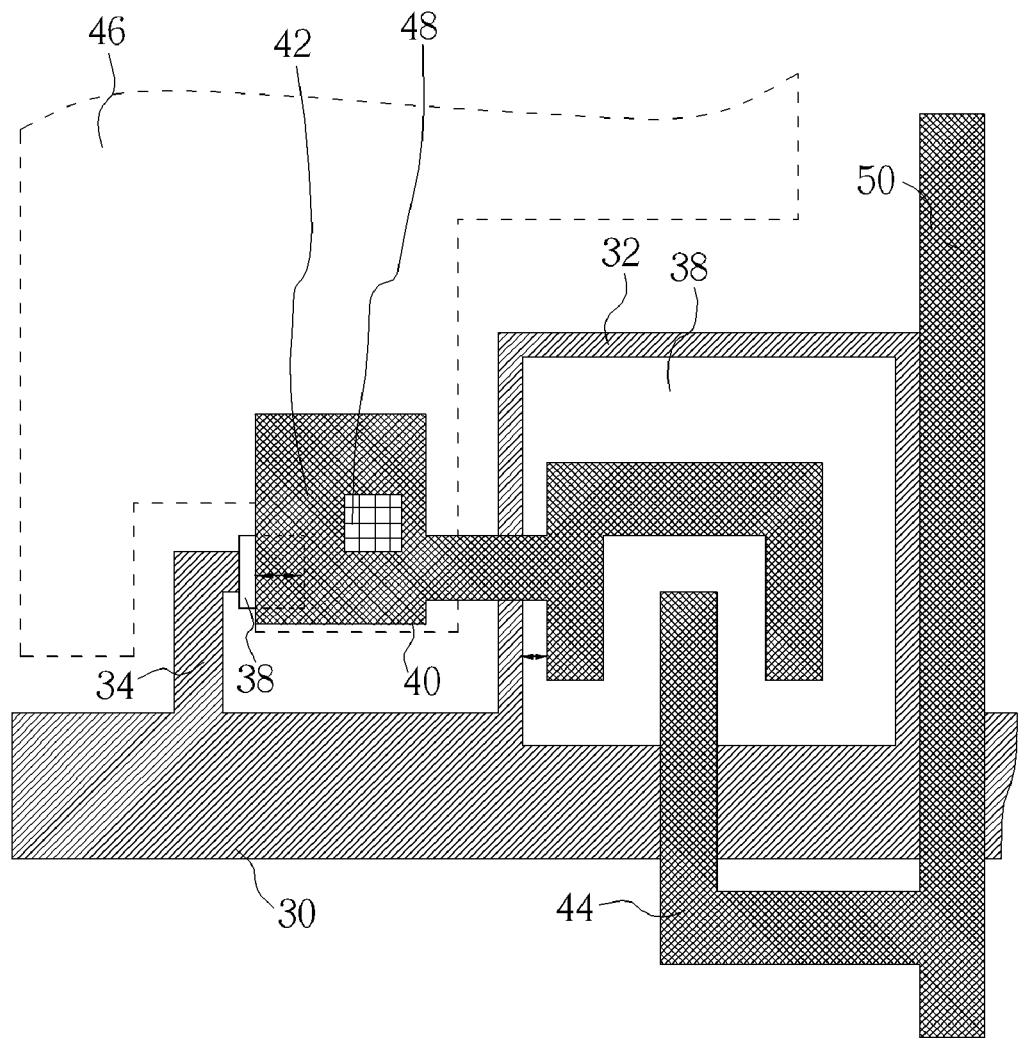
FIG. 9 is a schematic diagram illustrating the occurrence of the deviation in the third preferred embodiment of the present invention.

Refer to FIG. 8. FIG. 8 is a schematic diagram illustrating the structural layout of the third preferred embodiment according to the present invention. As shown in FIG. 8, the shapes and locations of the gate electrode 32, the gate electrode portion 34 are the same with that in the second embodiment. One end of the drain electrode 42 extends to the amorphous silicon layer 38 above the gate electrode 32, and the end terminal is U-shaped with an opening facing down. The drain electrode 42 partially overlaps the gate electrode 32 with the amorphous silicon layer 38 interposed therebetween to form a first parasitic capacitor (not shown in the figure). Another end of the drain electrode 42 partially overlaps the gate electrode portion 34 with the amorphous silicon layer 38 interposed therebetween to form a second parasitic capacitor (not shown in the figure). The length of a partially overlapping region between the drain electrode 42 and the gate electrode 32 is equal to the length of a partially overlapping region between the drain electrode portion and the gate electrode portion 34. The source electrode 44 is strip-shaped and corresponds to the center of the U-shaped drain electrode 42. Refer to FIG. 9 that is a schematic diagram illustrating the occurrence of the deviation in the third preferred embodiment of the present invention. As shown in FIG. 9, the drain electrode 42 transversely shifts. An area of a partially overlapping region between the non-U-shaped part of the drain electrode 42 and the gate electrode 32 with the amorphous silicon layer 38 interposed therebetween is decreased, and it can be compensated by an increased area of a partially overlapping region between the drain electrode 42 and the gate electrode portion 34 with the amorphous silicon layer 38 interposed therebetween. Accordingly, the total capacitance of the parasitic capacitor ($C_{gd}$) is relatively fixed.

As illustrated by the aforementioned embodiments, in the present invention, the gate electrode portion 34 of the gate electrode 32 of the first metal layer 30 extends out to serve as the compensation of the gate electrode 32 to withstand the occurrence of deviation in the photolithographic process. Therefore, the parasitic capacitor ($C_{gd}$) formed between the gate electrode 32 and the drain electrode 42 of the second metal layer 40 is invariable when deviation occurs in the photolithographic process.

Those skilled in the art will readily observe that numerous modifications and alterations of the device and method may be made while retaining the teachings of the invention.

What is claimed is:

1. A thin film transistor structure of a pixel, comprising:
   a first metal layer, which comprises a gate electrode, and a gate electrode portion extending from the gate electrode;
   an insulating layer disposed on the first metal layer;
   an amorphous silicon layer disposed on the insulating layer, the amorphous silicon layer being respectively disposed above the gate electrode and above the gate electrode portion; and
   a second metal layer disposed on the amorphous silicon layer, the second metal layer comprising a drain electrode and a source electrode, the source electrode being disposed on the amorphous silicon layer above the gate electrode, one portion of the drain electrode extending to the amorphous silicon layer above the gate electrode and another portion of the drain electrode extending above the gate electrode portion respectively, and the drain electrode partially overlapping the gate electrode and the gate electrode portion respectively with the amorphous silicon layer interposed therebetween.

2. The thin film transistor structure of claim 1, wherein a length of a partially overlapping region between the drain electrode and the gate electrode is equal to a length of a partially overlapping region between the drain electrode and the gate electrode portion.

3. The thin film transistor structure of claim 2, wherein a first parasitic capacitor is formed by the partially overlapping region between the drain electrode and the gate electrode with the amorphous silicon layer interposed therebetween, and a second parasitic capacitor is formed by the partially overlapping region between the drain electrode and the gate electrode portion with the amorphous silicon layer interposed therebetween.

4. The thin film transistor structure of claim 3, wherein a total capacitance of the first parasitic capacitor and the second parasitic capacitor is constant.

5. The thin film transistor structure of claim 1, further comprising a data line connected to the source electrode.

6. The thin film transistor structure of claim 1, wherein the drain electrode extends to a position corresponding to a center of the source electrode.

\* \* \* \* \*